United States Patent
Meinds

(10) Patent No.: US 7,761,695 B2
(45) Date of Patent: Jul. 20, 2010

(54) PROGRAMMABLE DATA PROCESSOR FOR A VARIABLE LENGTH ENCODER/DECODER

(75) Inventor: Kornelis Meinds, Waalre (NL)

(73) Assignee: Silicon Hive B.V., Eindhoven (NL)

( * ) Notice: Subject to any disclaimer, the term of this patent is extended or adjusted under 35 U.S.C. 154(b) by 371 days.

(21) Appl. No.: 11/575,318

(22) PCT Filed: Sep. 15, 2005

(86) PCT No.: PCT/IB2005/053033

§ 371 (c)(1),
(2), (4) Date: Mar. 15, 2007

(87) PCT Pub. No.: WO2006/033060

PCT Pub. Date: Mar. 30, 2006

(65) Prior Publication Data

US 2008/0320283 A1    Dec. 25, 2008

(30) Foreign Application Priority Data

Sep. 20, 2004   (EP)   ................... 04104527

(51) Int. Cl.
*G06F 9/305* (2006.01)
(52) U.S. Cl. .................................. 712/223
(58) Field of Classification Search .................. 712/223
See application file for complete search history.

(56) References Cited

U.S. PATENT DOCUMENTS

| | | | | |
|---|---|---|---|---|
| 5,481,364 A | * | 1/1996 | Ito | 382/244 |
| 5,668,548 A | * | 9/1997 | Bakhmutsky | 341/67 |
| 5,781,134 A | * | 7/1998 | Son | 341/67 |
| 5,821,887 A | * | 10/1998 | Zhu | 341/67 |
| 6,182,202 B1 | * | 1/2001 | Muthukkaruppan | 711/212 |
| 6,195,741 B1 | * | 2/2001 | Asato | 712/24 |
| 6,219,457 B1 | * | 4/2001 | Potu | 382/246 |
| 6,246,347 B1 | * | 6/2001 | Bakhmutsky | 341/67 |
| 2002/0084922 A1 | * | 7/2002 | Yagi | 341/67 |
| 2003/0085822 A1 | * | 5/2003 | Scheuermann | 341/67 |
| 2004/0120404 A1 | * | 6/2004 | Sugahara et al. | 375/240.23 |

OTHER PUBLICATIONS

Hashemian, R., Design and Hardware Implementation of a Memory Efficient Huffman Decoding, 1994, IEEE, pp. 345-352.*
Vitter, J.S., Algorithm 673 Dynamic Huffman Coding, 1989, ACM, ACM transactions on Mathematical Software, vol. 15, No. 2, pp. 158-167.*
Pan.,H., et al., Heads and Tails: A Variable-Length Instruction Format Supporting Parallel Fetch and Decode, 2001, ACM, pp. 168-175.*

* cited by examiner

*Primary Examiner*—Eric Coleman
(74) *Attorney, Agent, or Firm*—Leydig, Voit & Mayer Ltd.

(57) ABSTRACT

A data processing circuit has a programmable processor (12a, b) with an instruction set that comprises an new type of instruction. This instruction has a first operand that refers to a string of bits, and a second operand that refers to a position in that string of bits. The programmable processor (12a, b) is arranged to execute this type of instruction by returning, as a result, a code that is indicative of a count of a number of bits that occurs from said position in the string of bits until the string of bits from said position deviates from a predetermined bit pattern. The instruction is particularly useful for use in programs that perform variable length decoding and/or decoding.

6 Claims, 2 Drawing Sheets

PROGRAMMABLE DATA PROCESSOR FOR A VARIABLE LENGTH ENCODER/DECODER

Figure 1:
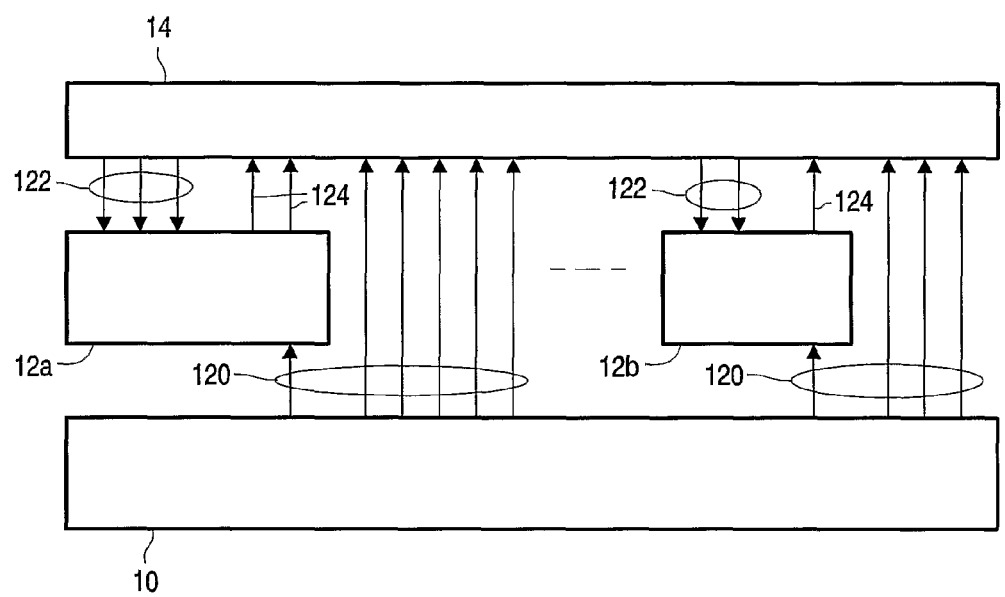

The invention relates to a data processing circuit that comprises a programmable processor. The invention also relates to a method of performing variable length decoding using such a programmable processor and to a programmable processor that is programmed to perform variable length decoding.

In "Application report SPRA805" (June 2002), published by Texas Instruments, titled "Variable Length Decoding on the TMS320C6200 DSP platform" an implementation of variable length decoding on a programmable signal processor is disclosed.

Variable length encoding is typically used for compressed encoding of data, such as video data in the popular MPEG format. A well-known form of variable length encoding is so-called Huffmann encoding. In a variable length code different encoded number values are encoded using code words with mutually different numbers of bits, so that the most frequently occurring number values are encoded using the shortest codewords. This reduces storage requirements and/or required transmission bandwidth during storage and/or transmission of encoded data.

When a stream of number values is encoded, a series of such code words is concatenated to form a bit string. Each variable length codeword consists of a series of bit values that does not occur at the start of any other code word of greater length than the code word. As a result, the length of the codeword can be determined from the bits in the bit string from the start of a code word. In principle decoding can be implemented by means of a lookup mechanism, taking the maximum number of bits that can occur in an encoded word and using these bits as an address in tables to lookup the codeword length of the code word and the decoded word (if the actual codeword is smaller than the maximum length all entries in the tables at addresses that start with the bits of the codeword contain the same codeword length and decoded codeword).

For practical codes a smaller lookup table can be used, as described in the Application report SPRA805. For this purpose a count of the number of leading zeros or ones from the start of the code word is used to form the lookup table address. This is based on the fact that practical codes generally use the same header part for code words of the same length (the header part consisting of logic ones or zeros). In this case the lookup operation uses a lookup address that is made up of this count, in combination with a number of bit values at the positions that follow the first bit in the codeword that deviates from the header part. Because the count can be represented with fewer bits than the number of leading ones or zeros, this reduces the lookup address space.

Various implementations of variable length decoding exist. Of course, the decoding process can be implemented using circuitry that is designed to perform only the decoding function. Typically, however, a suitably programmed processor is used, which also executes programmed instructions to perform other functions besides variable length decoding (e.g. other parts of MPEG decoding). The use of a programmed processor has the advantage that little or no additional circuitry is needed to perform variable length decoding in addition to these other functions.

The Application report SPRA805 describes the use of a "NORM" instruction to speed up variable length decoding. The NORM instruction is known in the context of floating point arithmetic, where it is used to determine a count of the number of redundant sign bits (successive ones or zeros) at a start of a number. In the context of variable length decoding this instruction can be used to form the look-up address to retrieve the codeword length and the decoded word.

The variable length decoding program causes the TMS320C62000 DSP each time to move a next part of the bit string that contains successive codewords into an operand register. These parts are selected so that they start each time with the bits of a next codeword. The program uses the NORM instruction to obtain the count of successive ones or zeros from the start of the operand and with this count the program forms an address in the lookup table. By means of lookup with this address the program determines the length of the codeword and from the length of the codeword the start of the next codeword in the bit string is determined. Then a new operand is formed from the bit string, starting from the next codeword, after which the process is repeated.

In a DSP (Digital Signal Processor) like the TMS320C62000, instructions from the program can be executed in parallel to speed up execution. However, in the case of variable length encoding this can be used only to a limited extent, because the length of a codeword has to be determined each time before the next codeword can be processed. This makes variable length decoding inefficient. It has been found that there is room for improvement.

It is an object of the invention to provide for a processor that supports efficient programming of variable length decoding.

It is an object of the invention to provide for a processor that is programmed to execute variable length decoding efficiently.

It is an object of the invention to provide for a method of performing efficient execution of variable length decoding.

The processor according to the invention is set forth in claim 1. According to the invention the processor is structured to include, in its instruction set, an SNORM instruction that has a bit string operand that contains a bit string and a position operand that indicates a position within the bit string. The processor is structured to return a length code that represents a count of a number of bits from the indicated position in the bit string until a first subsequent position where the bit string deviates from a predetermined pattern, such as a pattern of all logic ones or all logic zero's.

As is well known, the instruction set of a processor informs the skilled person which types of functional circuits must be included in the processor. The instruction set is the collection of different species of instructions that the processor can execute from a program. Well-known general-purpose instruction species that are usually part of an instruction set include instructions like ADD, SHIFT, LOAD, STORE etc. According to the invention a processor is provided that includes the SNORM instruction in its instruction set.

When the processor is programmed to perform variable length decoding, the SNORM instruction can be used to obtain the length code of the leading part of the codeword without first requiring separate instructions to form an operand with a part of the bit string that starts from the next codeword. Instead, the position operand is used to indicate the start of the codeword in an existing bit string operand, and a length code for a selectable internal part of that bit string operand is obtained. Only the position operand needs to be updated for successive code words. The bit string need not be updated until the code word crosses the boundary of the bit string in the bit string operand.

Preferably, only a predetermined number of least significant bits from the position operand determine the position from which the bits are counted, the more significant bits of the position operand being ignored. Preferably, the number of least significant bits that is used corresponds to the bit length of the bit string operand. In this way a register that is used to provide the position operand may contain more significant bits that point to different words within the bit stream that contains the concatenated variable length codewords.

Preferably, the SNORM instruction refers to at least two separately selectable registers that contain bit string operands, which contain successive parts of the bit string. In this case, the processor preferably is arranged to obtain the length code of the leading part of the codeword until a first subsequent position where the bit string deviates from a predetermined pattern, counting positions in the leading part from more than one bit string operand when the pattern continues from one of the bit string operands to another.

Also preferably, the SNORM instruction returns an additional result that contains bits from the bit string operand starting from a predetermined relative position relative to the first position where the bit string deviates from the predetermined pattern (typically from this first position). A variable length decoding program preferably uses this additional result in combination with the length code to form the lookup table address. In a further embodiment, the processor is arranged to execute the SNORM instruction so that the combination of the length code and a predetermined number of bits of the additional result is returned as lookup table address (in this case the processor need not return separate results for the length code and the additional result in response to the SNORM instruction). This reduces the number of instructions that has to be executed for variable length decoding. However the use of separate result outputs of the SNORM instruction for the length code and the additional result has the advantage that it makes the processor more flexible with respect to the different variable length codes that can be decoded.

These and other objects and advantageous aspects of the invention will be illustrated using non-limitative examples that will be described with the aid of the following figures.

Figure 2:
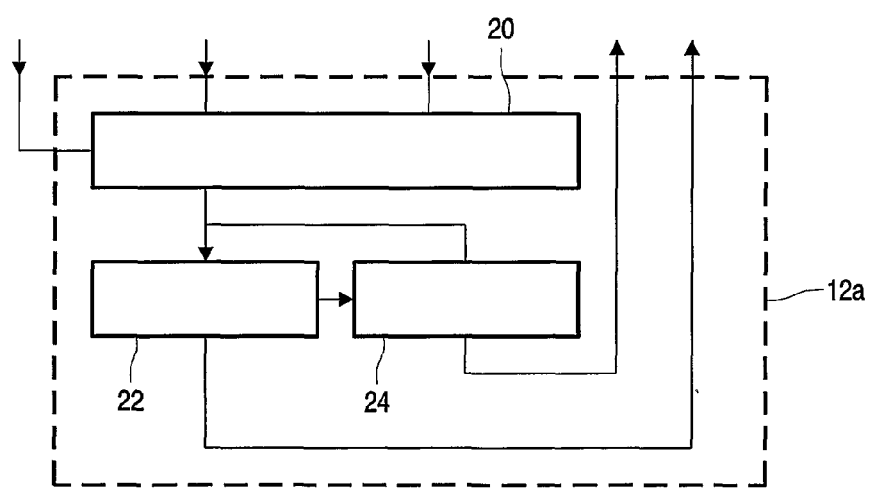
Figure 3:
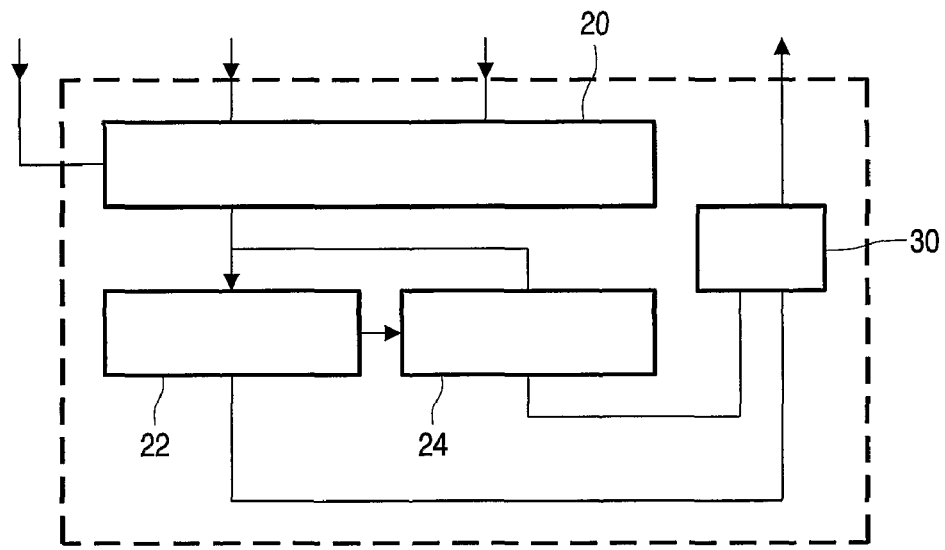
Figure 4:
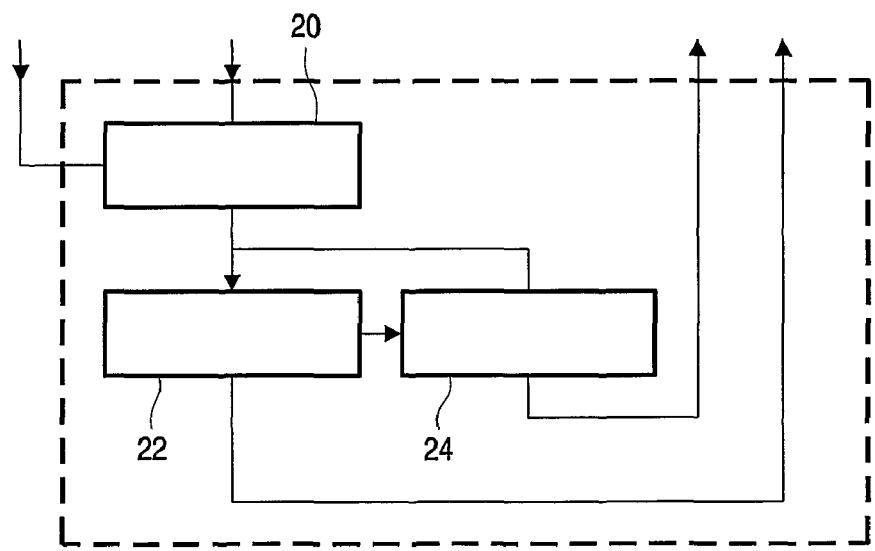

FIG. 1 shows a processor circuit
FIG. 2 shows part of a functional unit
FIG. 3 shows part of an alternative functional unit
FIG. 4 shows part of a further functional unit FIG. 1 shows an example of a programmable processor circuit. The circuit contains an instruction issue unit 10, functional units 12*a,b* and a register file 14. Instruction issue unit has outputs 120 for issuing command codes and register selection codes, Register file 14 has inputs for receiving the register selection codes, outputs 122 for outputting operand data from selected registers and inputs 124 for receiving result data that has to be written to selected registers. Functional units 12*a,b* have inputs for receiving the command codes and the operand data and outputs for outputting results of operations.

In operation instruction issue unit 10, which may contain an instruction memory and a program counter (not shown), produces instructions of a program that must be executed successively. Instruction issue unit derives commands from the instruction and applies operation codes from the commands to functional units 12*a,b* and register selection codes to register file 14. The register selection codes include operand register selection codes that are derived from the commands and result register selection codes that are derived from the commands. In response to the operand register selection codes register file 14 retrieves operand data from registers that are selected by the operand register selection codes and applies this data to functional units 12*a,b*. The operation codes select operations that must be performed by functional units 12*a,b*. Under control of the operation codes functional units 12*a,b* perform the selected operations using the operand data and produce result data. Register file 14 receives the result data from functional unit and stores the result data in registers that are identified by the result register selection codes.

Although a specific example of a programmable processor circuit is shown, it should be realized that the invention is not limited to this example. For example, register file 14 may comprise a plurality of register files, from which operand data can be loaded or in which result data can be stored. Furthermore, although functional units 12*a,b* are shown that have three and two operand inputs respectively, and two and one result output respectively, it should be understood that functional units with other numbers of operand inputs and/or result outputs are possible. Furthermore, although no details have been given about timing it should be understood that typically pipelining will be used, so that operand register selection codes from an instruction will be applied to register file 14 while a functional unit 12*a,b* executes an operation selected by a previous instruction and that the result register selection code may be applied only later. However, without deviating from the invention other forms of timing may be used.

Furthermore, any number of functional units 12*a*, *b* may be used, e.g. one functional unit only or a larger number. In the following, programs of the programmable processor will be described as a series of successive instructions. But it should be understood that preferably a plurality of functional units 12*a*, *b* is used, so that different ones of the successive instructions may be executed in parallel by different functional units 12*a,b*, as far as permitted by data dependencies between the instructions. The functional circuits that must be included in the processor are determined by the instruction set of the processor circuit. The instruction set is the collection of different species of instructions (also called "commands" herein) that the processor can execute as commands from a program. (As used herein, instructions (or equivalently command) are the indivisible "atoms" of a machine executable program, so that instructions (or commands) in this sense cannot be divided into sub-instruction parts that can be issued to the processor for execution). The instruction species of each instruction in a program is usually expressed by the content of an operation code field of the instruction, which the processor uses to control its operation. Well-known general-purpose instruction species that are usually part of an instruction set include instructions like ADD, SHIFT, LOAD, STORE etc. In a programmable processor instructions from the instruction set may be used as alternatives to one another at any point in the program. According to the invention a processor is provided that includes the SNORM instruction in its instruction set, to which the processor responds as described in the following.

According to one aspect of the invention at least one of the functional units 12*a* is designed to support a command that will be denoted symbolically as

SNORM R1, R2, R3, R4, R5

This command has three operands, identified by register references R1, R2, and R3 that refer to registers wherein the three operands are stored. The command results in two results. The register references R4, R5 denote reference to the registers wherein the results must be stored. Typically, the command, as stored in instruction memory contains respective fields of bits that identify the instruction (SNORM) the operand register addresses (R1-3) and the result register addresses (R4-5).

When a program that contains the SNORM command is executed, instruction issue unit 10 retrieves an instruction (that can be one of a plurality of parallel retrieved instructions) that represents this command and in response applies an operation code that identifies the SNORM instruction to functional unit 12a. Also, instruction issue unit 10 applies codes that correspond to the registers R1-5 that are identified in the instruction to register file 14.

The circuitry of functional unit 12a is structured so that, in response to the SNORM operation code functional unit 12a produces a length code that represents a count of the number of successive bits with mutually the same bit value starting from a position that is indicated by the third operand, in a concatenation of the bits strings in the first two operands. Furthermore, instruction functional unit 12a produces a shifted version of the concatenation, shifted over a number of bit positions equal to the third operand plus the count of the number of successive bits.

For the purpose of illustration, in an example, the operands could have a length of eight bits and in this case, the first two operands (referred to by R1, R2) may contain for example the bit strings 0010 1011 and 1110 0101

It should be appreciated that in practice a much larger number of bits is preferably used in each operand, for example sixteen or thirty-two bits or sixty-four bits in each operand. Eight bit operands are used merely for the sake of illustration. With the operands of the example the concatenated bit string is 0010 1011 1110 0101

Now if the third operand (referred to by R3) has the value six, a length code for the number five would be returned (to register R4), which is the number of logic ones in the concatenation starting from the sixth bit position (the numbers of the positions start from zero at the leftmost position in the concatenation and increase from left to right). In the example, the bit positions will be counted starting from the left, i.e. from the most significant bit, however, it should be understood that the bit positions may alternatively be counted from the right, i.e. starting from the least significant bit position. The shifted output (in register R5) has the value 0010 1000

These are the last five bit values of the concatenated bit string, plus three zero bit values substituted at the right.

Preferably, the most significant bits of the third operand are ignored during execution of the operation so that the position never exceeds the length of one operand. This is equivalent to using the remainder of this third operand when divided by the length of the first operand (in the example, the remainder when the third operand is divided by eight).

From the functional description of the operands and effect of the SNORM instruction the skilled person will be able to determine the circuits that may be used to implement a processor that has this instruction in its instruction set. An example of such a processor will be described.

FIG. 2 illustrates an embodiment of part of a functional unit 12a that is activated when the operation code to perform the SNORM command is applied to the functional unit 12a. The part contains a first barrel shifter 20, a sign length computation unit 22 and a second barrel shifter 24. First barrel shifter 20 has shift data input coupled to two operand data inputs of functional unit 12a, for receiving operand data that has been referred to by two of the register references R1, R2. First barrel shifter 20 has a shift control input coupled to a third operand data input of register file 14 that has been referred to by a third of the register references R3. First barrel shifter 20 has an output coupled to an input of sign length computation unit 22. Sign length computation unit 22 has an output coupled to a first output for a result of the functional unit 12a and to the shift control input of second barrel shifter 24. Second barrel shifter 24 has a shift data input coupled to the output of first barrel shifter 20 and an output coupled to a second output for a result of the functional unit 12a.

It should be appreciated that only part of the functional unit 12a is shown. In practice the functional units may contain more circuits for performing other operations in response to other operation codes, or barrel shifters 20, 24 and/or sign length computation unit 22 may be part of larger circuits that are capable of performing other operations as well. In addition multiplexing circuits may be present to select from and/or to which various data is supplied Furthermore a decoding circuit may be present that is used to activate selected parts of the functional unit or to control multiplexing circuits dependent on the command that has been received. For the sake of clarity only the parts of the circuit are shown that are involved in execution of the SNORM instruction.

First barrel shifter 20 is constructed to produce an output bit string that contains a shifted version of bits of a concatenation of its first and second operand data R1, R2. In the eight-bit operand example that has been described above the shift data inputs of barrel shifter 20 would receive the operand data bit strings 0010 1011 and 1110 0101

The amount of shift is selected by the third operand data R3. In the example the shift control input would receive the value six and first barrel shifter 20 would produce an output string 1111 1001 0100 0000

Herein first barrel shifter has shifted the concatenation to the left over six positions and six zeros have been added at the right. Barrel shifter circuits are known per se. Therefore no detailed circuit implementation will be given. The particular implementation that is used is not relevant to the invention.

Preferably the most significant bits of the third operand are ignored during execution of the operation, so that the amount of shift never exceeds the length of one operand. This is equivalent to using the remainder of this third operand when divided by the length of the first operand (by sixteen, thirty two or sixty four for example).

Sign length computation unit 22 determines a count of the number of successive bits with mutually the same bit value in a concatenation of the bits strings in its input string, starting from the first position in the input, which results in a count of five in the example, because there are five successive logic one bits in the input.

The particular implementation of sign length computation unit 22 that is used is not relevant to the invention. Example of implementations can be found in floating point arithmetic circuits, where the length computation is used to normalize a result of an arithmetic operation (i.e. to shift a part of the result that starts with the last sign bit to a predetermined position).

Second barrel shifter 24 shifts the output bit string of first barrel shifter 20 to the left over an additional number of bit positions. This additional number of positions is controlled by the count that is output by sign length computation unit 22. Only the leftmost word of the result of this operation is output to the register file 14 at the output of the functional unit 12a. In the example, the result would be 0010 1000

In this example the word size is eight bits, but of course a greater number of bits may be output if operands and results with a greater word size, such as sixteen, thirty-two or sixty four are used.

Of course other implementations of functional unit 12a may be used to realize the same effect. For example, the functions of second barrel shifters 24 and sign length computation unit 22 may be performed by combined circuits and/or a circuit may be used that performs the function of sign length computation unit 22 directly on the operand data of functional unit 12a, under control of the third operand.

The SNORM instruction can be used to increase the speed at which successive variable length code words can be decoded. The following is an example of a program that can be used to perform decoding

```
bptr = 0;
wptr = 0;
word0 = buf[wptr];
word1 = buf[wptr+1];
while (wptr<end)
{   nrm, sucbits=OP_SNORM(word0, word1, bptr );
    index= getIndex(nrm, sucbits);
    len= lenTable[index];
    dec=codeTable[index];
    bptr = bptr + len;
    wptr=bptr>>5;
    word0= buf[wptr];
    word1= buf[wptr+1];
}
```

This program is expressed in pseudo code statements that conform largely to statements in the well-known C language (in this language [ ] denote indexing of an array and >> denotes a shift to the right). As will be appreciated, the C language has been chosen merely for the sake of clarity, to describe a series of corresponding machine instructions. The statement with the function call to OP_SNORM refers to execution of the SNORM instruction that has been described in the preceding.

In the program, "buf" denotes an array of memory locations wherein successive words (being 32-bits values) are stored that form a bit stream that contains concatenated codewords from a variable length code. Pointer variables bptr and wptr are used. wptr indicates the position of word from "buf" that contains the start of a current codeword. Variables word0, and word1 (whose values are kept in respective registers in register file 14) contain copies of this word from "buf" and the next word from "buf" respectively. The least significant bits of bptr indicate the position of the first bit of the current code word in the variable word0. The most significant bits of bptr correspond to wptr.

Although the program uses named variables to hold data for the sake of clarity, it should be understood that these names typically stand for registers wherein the corresponding data is stored.

Although the program is expressed as a series of instructions, it should be emphasized that, when the processor contains a plurality of functional units and an instruction issue unit that can issue instructions to this plurality in parallel, different ones of the instructions of the program may be executed in parallel by different functional units, as far as possible within the constraints imposed by data dependencies. Also the sequence of execution of the instruction may be different from the sequence in the program if this is consistent with data dependencies.

The "while" loop performs variable length decoding. However, for the sake of clarity instructions that use of the decoded words (such instructions to stored the decoded words in an array) have been omitted from the loop. In a first instruction in the loop, the SNORM instruction is executed. This involves determination of the length code of the number of mutually equal bit values from the position indicated by bptr in the concatenation of word0 and word1. In the preferred embodiment the functional unit only uses the five least significant bits of bptr for this purpose when 32 bit operands are used (or more or fewer bits if the operands are longer or shorter). Of course, these bits also may be masked out from bptr by an instruction in the program if the functional unit does not do so, or a separate pointer may be used whose value never exceeds 31.

The resulting length code is stored in a register that is denoted by the variable "nrm". In addition the concatenation of word0 and word 1 is shifted over nrm+(bprt modulo 32) bits and the result is stored in a register that is denoted by the variable "sucbits".

In the second instruction in the while loop an index value is formed from the length code and the start of the content of the variable "sucbits". This index value is used as an index to retrieve the length of the code word from a length table "lenTable" and to retrieve the decoded code word from a code table "codeTable". Next, the variable bptr is incremented by adding the retrieved length. Also values of word0 and word1 for the new value of bptr are retrieved. After that the loop is repeated.

It should be emphasized that the program merely serves to illustrate the use of the SNORM operation. Many alternative version of a program with the SNORM instruction are possible.

In the described preferred embodiment execution of the SNORM instruction by functional unit 12a produces a count of the number of successive bits that have mutually the same bit value from the bit position pointed at by bptr to the first next bit position where a different bit value is encountered. That is, the number of bits in a series of logic zeros or logic ones is counted. However, the invention is not limited to this embodiment. In another embodiment functional unit 12a produces counts only series of logic ones, in yet another embodiment functional unit 12a counts only series of logic zeros. In another embodiment functional unit 12a counts the number of bit positions from the position selected by bptr until a first bit value is found that deviates from a predetermined sequence. With a suitable implementation of the functional unit, this predetermined sequence can be any predetermined sequence, not just a series of logic ones or a series of logic zeros. Use of such another series may be useful if a variable length code is used wherein deviation from such a sequence is used to indicate that no more than a predetermined number of bits of the code word will follow. Therefore, the invention is not limited to counting bit positions for predetermined sequences of all ones or zeros.

Preferably, the maximum length that the length code "nrm" can return is limited to at most the maximum length of the variable length codewords. If more than a predetermined number of successive bits according to the predetermined pattern is encountered a predetermined maximum length code is returned.

Preferably, the length code "nrm" represents the length by means of the same conventional number representation that the processor uses for all numbers. But is not necessary. For the program example arbitrary codes may be used to distinguish different lengths, since the codes are used only to form an index for use in tables lenTable, codeTable. The entries in these tables may be rearranged to accommodate any kind of code.

However, whatever code is used, the number of bits N in the length code "nrm" is preferably significantly shorter than the maximum length L that the length code represents. In this way, use of the length code nrm as part of an index for table look up the decoded word and the code word length significantly reduces the size of the required lookup tables. Preferably, the length code L is encoded so that L equals two to the power N, so that lookup tables of minimum size are required. To represent a length of maximally sixteen bits, for example, a length code of only four bits suffices.

It should be appreciated that the invention is not limited to the SNORM instruction as described thus far. For example, instead of an SNORM instruction that produces the length code "nrm", an instruction may be used that directly produces the index value. Alternatively, an additional instruction may be included in the instruction set to compute the index value. In one embodiment the index value may be formed by concatenating a predetermined first number of bits of the result variable "sucbits" after the length code nrm. In an example the predetermined number of sucbits is four and the computation of the index value corresponds to (in C code)

index=(nrm<<4)|(sucbits>>(32−4))

Of course other methods of computing index values may be used. This example assumes that a variable length code is used wherein at most four extra bits from a codeword after the first deviation from a predetermined bit string are sufficient to distinguish code words. Different index values may be used if less or more extra bits are needed, or the information from nrm and "sucbits" could be combined in a different way.

In an embodiment an instruction is included in the instruction set to compute the index value this instruction can be described symbolically as

INDX R1, R2, R3, R4

Herein R1-3 refer to operand registers that contain nrm, sucbits and a number (e.g. 4) of the bits from R2 that must be included in the index value. The index value is written to register R4. Optionally, the third operand may be omitted (if e.g. a default number is used).

FIG. 3 shows an example of a functional unit that is arranged to output the index value is output as a result of the SNORM instruction. A combining circuit 30 is added to form the index result from the length code from the outputs of sign length computation unit 22 and second barrel shifter 24. It should be appreciated that combining circuit 30 is very simple: it merely involves connections of predetermined bit lines of the outputs of sign length computation unit 22 and second barrel shifter 24 to the result output.

With this functional unit only one result output connection to register file 14 is needed and the command from instruction issue unit 10 needs to address only one result register. It will be appreciated that the combining circuit 30 can easily be combined with any implementation of the remaining part of the functional unit. However, the disadvantage is that the functional unit becomes specific for a particular class of variable length codes (because of the predetermined number of bits of the output of the barrel shifter that is used to form the result).

In another embodiment a different SNORM instruction is used wherein only the length code "nrm" is produced as a result. In an implementation of this embodiment the second barrel shifter and its result output may be omitted. In this case, the program preferably contains one or more instructions to compute the index value from word0, word1, nrm and bptr. In a further embodiment a functional unit is arranged to support a further dedicated instruction for this purpose. In a first embodiment the function performed in response to this further instruction includes for example selecting a predetermined number of successive bits from the concatenation of a first operand and a second operand (word0 and word1) starting from a bit position that is indicated by a third operand. The result of such a function corresponds to concatenation (R1, R2)<<R3

In this embodiment the third operand is computed by adding bptr and nrm. The result is equivalent to the "sucbits" result described earlier.

In another embodiment both nrm and bptr are used as operands in addition to word0 and word1 in a dedicated instruction. In this embodiment execution of the instruction involves adding nrm and bptr to determine the amount of shift and nrm may be used to form the index in combination with the shift result. The result of such a function corresponds for example to (in C code)

(nrm<<4)|(concatenation (R1, R2)<<(28−(R3+R4)))

Here the number 28 equals the difference between the word length (32) and the number of bits (4) of the concatenation that is used in the index. Of course different numbers may be used, dependent on the variable length code.

In an embodiment the processor is designed to supports an SNORM instruction with only two operands, only one operand being used to provide the bit string that contains the variable length code words. A second operand points to a position in the bit string operand. Preferably, only a part of second operand is used that points within half of the bit string operand. In this embodiment, in response to the SNORM instruction the processor returns a length code of a series of bits starting from a position in a first half of the bit string operand, the position being indicated by the second operation.

FIG. 4 shows embodiment of a functional unit that supports this embodiment of the SNORM instruction with only two operands. In this embodiment a single length first barrel shifter 20 is used. A second operand is applied to the shift control input of this first barrel shifter 20, and preferably only a least significant part of the value of this operand, which selects a position within half an operand, is used to control the first barrel shifter 20.

The following is an example of a program that makes use of such an SNORM instruction, for the case wherein the variable length code words are never longer than half an operand.

```
bptr = 0;
wptr = 0;
top0= buf[wptr];
word0= buf[wptr];
word1= buf[wptr+1];
while (wptr<end)
{  nrm, sucbits=OP_SNORM(top0, bptr );
   aux= (word0<<16) | ((word1>>16) &0xffff);
      index= getIndex(nrm, sucbits);
      len= lenTable[index];
      dec=codeTable[index];
      bptr = bptr + len;
      wptr=bptr>>5;
      word0= buf[wptr];
      word1= buf[wptr+1];
      if(bptr&31>16) top0= aux; else top0=word0;
}
```

It should be noted that only a single variable top0 with a bit string is used as an operand for the SNORM instruction in this case. A shift operation has been added to shift in half of the variable word1 into a variable aux that may be used as operand of the SNORM instruction. The value from the variable aux is used when the variable bptr points to the second half of the bit string operand. It should be noted that a predetermined shift distance of half a word (sixteen in the example) is used, so that the required shift operations can be performed before the length of the code word is known (in parallel with other operations).

Only the selection of the bit string operand has to be postponed until after the length is known.

As will have become clear, the invention provides for the addition of a selected instruction to the instruction set of the processor, to support variable length decoding. The functional description of the response to the instruction informs the skilled person about the function of the circuits that must be used in the processor. The added instruction preferably reduces the number of successive instructions that is needed to perform variable length decoding, and on the other hand addition of the added instruction preferably requires the addition of as little as possible additional hardware to execute the instruction. If the number of successive instructions that needs to be executed for variable length decoding is not reduced, or at least the number of instruction cycles that is needed is not reduced or the number of necessary registers is not reduced, there is no advantage over a processor with only general-purpose instruction types. On the other hand, if the additional instruction would require so much additional hardware that it would be cheaper to implement a complete dedicated variable length decoding circuit, there is no advantage over such a dedicated variable length decoding circuit.

Although an application of the invention to variable length decoding has been described, it should be appreciated that an embodiment of the SNORM instruction may also be used for variable length encoding, for example to determine the number of sign bits of a number that has to be encoded. In this case, the number of sign bits can be used to simplify lookup of the code word.

The invention claimed is:

1. A data processing circuit comprising:
a programmable processor with an instruction set that comprises an instruction with a first operand that refers to a string of bits, and a second operand that refers to a position in the string of bits,
the programmable processor being arranged to return, as a result of executing said instruction, a length code that is indicative of a count of a number of bits that occurs, from said position in the string of bits, until the string of bits from said position deviates from a predetermined bit pattern, and
wherein the instruction has a third operand that refers to a further string of bits for extending said string of bits, wherein the bits that are counted in the count include bits from positions starting from said position and continuing from the end of the bit string into a start of the further bit string, when the bits from said position until the end of the bit string do not deviate from the pattern.

2. The data processing circuit according to claim 1, programmed with a program to perform decoding of variable length codewords, the program containing preliminary instructions to load successive parts of a bit stream that contains the variable length codewords into respective registers, the program containing a call of said instruction using the respective registers as first and third operands, followed by a further instruction that uses the length code to look up a length of the codeword.

3. A data processing circuit comprising:
a programmable processor with an instruction set that comprises an instruction with a first operand that refers to a string of bits, and a second operand that refers to a position in the string of bits,
the programmable processor being arranged to return, as a result of executing said instruction, a length code that is indicative of a count of a number of bits that occurs, from said position in the string of bits, until the string of bits from said position deviates from a predetermined bit pattern,
wherein the processor is arranged to return an additional result in response to the instruction, the additional result containing successor bits from the bit string starting from a predetermined relative position relative to a first bit location where a bit following said position deviates from the predetermined pattern, and
the data processing circuit being programmed with a program to perform decoding of variable length codewords, the program containing a call of said instruction followed by a further instruction that uses an index derived from the length code that is produced by the instruction to look up a length of the codeword.

4. The data processing circuit of claim 3, wherein the program contains instructions to call said instruction a plurality of times, each time with the same first operand, each time with a successive value of the second operand, indicating successive positions where successive codewords start in the bit string.

5. A data processing circuit comprising:
a programmable processor with an instruction set that comprises an instruction with a first operand that refers to a string of bits, and a second operand that refers to a position in the string of bits,
the programmable processor being arranged to return, as a result of executing said instruction, a length code that is indicative of a count of a number of bits that occurs, from said position in the string of bits, until the string of bits from said position deviates from a predetermined bit pattern, and
wherein the program contains instructions to call said instruction a plurality of times, each time with the same first operand, each time with a successive value of the second operand, indicating successive positions where successive codewords start in the bit string.

6. A data processing circuit comprising:
a programmable processor with an instruction set that comprises an instruction with a first operand that refers to a string of bits, and a second operand that refers to a position in the string of bits,
the programmable processor being arranged to return, as a result of executing said instruction, a length code that is indicative of a count of a number of bits that occurs, from said position in the string of bits, until the string of bits from said position deviates from a predetermined bit pattern,
wherein the processor is arranged to return an additional result in response to the instruction, the additional result containing successor bits from the bit string starting from a predetermined relative position relative to a first bit location where a bit following said position deviates from the predetermined pattern, and
the data processing circuit being programmed with a program to perform decoding of variable length codewords, the program containing a call of said instruction followed by a further instruction that uses an index derived from the length code and the additional result of the instruction to look up a length of the codeword.

* * * * *